(12) United States Patent
Verspecht

(10) Patent No.: US 6,943,561 B2
(45) Date of Patent: Sep. 13, 2005

(54) METHOD OF AND AN APPARATUS FOR COLLECTING RF INPUT AND OUTPUT AND BIASING SIGNAL DATA OF A DEVICE UNDER TEST

(75) Inventor: Jan Verspecht, Steenhuffel (BE)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/252,807

(22) Filed: Sep. 23, 2002

(65) Prior Publication Data

US 2003/0057964 A1 Mar. 27, 2003

(30) Foreign Application Priority Data

Sep. 24, 2001 (EP) ............................................. 01203653

(51) Int. Cl.⁷ ............................................. G01R 27/02
(52) U.S. Cl. ........................ 324/603; 324/605; 324/606
(58) Field of Search ................................. 324/603, 750, 324/642, 605, 606, 637

(56) References Cited

U.S. PATENT DOCUMENTS

| | | | |
|---|---|---|---|
| 4,556,841 A | | 12/1985 | Carlson .................... 324/73 R |
| 4,808,912 A | * | 2/1989 | Potter et al. ................. 324/601 |
| 5,034,708 A | | 7/1991 | Adamian et al. ............ 333/161 |
| 5,307,284 A | * | 4/1994 | Brunfeldt et al. ............. 702/76 |
| 5,404,109 A | | 4/1995 | Pribble et al. ............... 324/603 |
| 5,532,648 A | * | 7/1996 | Culling ....................... 330/289 |
| 6,525,545 B2 | * | 2/2003 | Hill ............................ 324/642 |

FOREIGN PATENT DOCUMENTS

EP 0 715 177 6/1996

OTHER PUBLICATIONS

Fritz, S., Examiner, European Search Report, Application No. EP 01 20 3653, dated Apr. 17, 2002.
Teeter et al. "Prediction of HBT ACPR . . . " Technical Digest Oct. 12, 1997, New York, pp. 41–44, XP010251622.
Ferrero A. et al. "Novel hardware and Software Solutions . . . " IEEE Transactions on Instrumentation and Measurement, New York, vol. 43, No. 2, Apr. 1, 1994, pp. 229–305, XP000439069.

* cited by examiner

*Primary Examiner*—Anjan Deb
*Assistant Examiner*—John Teresinski

(57) ABSTRACT

Radio Frequency (RF) signal network measurement data of a device under test are acquired by exciting the device using a modulated RF excitation signal, while measuring RF signal data at the signal ports of the device, measuring bias signal data, and processing the RF signal data and the bias signal data, providing the RF signal network measurement data of the device. By acquiring bias signal data, in particular by measuring variations in the bias signals, a more accurate and reliable characterization of the non-linear behavior of the device under test can be provided. A Non-linear Network Measurement System (NNMS) is arranged for acquiring the RF and biasing signal data and characterizing the non-linear signal behavior of a device under test.

27 Claims, 5 Drawing Sheets

METHOD OF AND AN APPARATUS FOR COLLECTING RF INPUT AND OUTPUT AND BIASING SIGNAL DATA OF A DEVICE UNDER TEST

FIELD OF THE INVENTION

The present invention relates generally to Radio Frequency (RF) and microwave technology, and more specifically to the measurement and processing of signal data of a device under test.

BACKGROUND OF THE INVENTION

State of the art Non-linear Network Measurement Systems (NNMS) are arranged for performing measurement of the RF voltage and current waveforms at the ports of an RF and microwave device under test, under periodic Continuous Wave (CW) and modulated excitation conditions.

These measurement systems are capable of acquiring information on the non-linear RF signal behavior of a device under test compared to classical measurement techniques using well known network analyzers for analyzing the linear behavior of RF and microwave devices.

However, among others, with the growing importance of wireless communication technology, there is a need for an even more accurate characterization of the non-linear RF signal behavior of RF and microwave devices, in particular devices arranged for use with Code Division Multiple Access (CDMA) techniques.

It has been observed that state of the art NNMS are not capable of providing a complete characterization of the non-linear signal behavior of RF and microwave devices, such as amplifiers, mixers and the like under relatively large, modulated signal excitation conditions wherein DC settings of a device remain not constant, but show a dynamic behavior dependent on the modulation of the excitation signals.

One of the effects observed of this type of non-linear distortion is the broadening of the output signal spectrum relative to the input signal spectrum, which is called "spectral regrowth".

SUMMARY OF THE INVENTION

It is an object of the present invention to provide an improved measurement and processing method for providing a complete characterization of the signal behavior of an RF and microwave device, in particular its non-linear RF signal behavior under large-signal modulated operating conditions.

It is a further object of the present invention to provide an apparatus for performing the improved measurement and processing method according to the invention, in particular a Non-linear Network Measurement System (NNMS) arranged for non-linear signal data acquisition of a device under test.

According to the present invention, in a first aspect thereof, there is provided a method of collecting Radio Frequency (RF) signal network measurement data of a device under test, the device having signal ports and bias input terminals, the method comprising the steps of:

applying bias signals at the bias input terminals of the device;

exciting the device by a modulated RF excitation signal;

measuring RF signal data at said signal ports of said device;

measuring bias signal data, and processing the RF signal data and the bias signal data, providing the RF signal network measurement data.

The invention is based on the insight that the RF output signal of the device under test can be effectively compensated for variations in the DC settings by measuring the DC bias signals of the device during excitation thereof, in particular by measuring variations in the bias signals.

The method according to the invention is in particular of advantage for providing a more reliable and accurate characterization of the non-linear RF behavior of device under test if excited by a periodically modulated RF excitation signal. It has been observed that under periodically modulated excitation conditions the biasing voltages and/or currents of the device start "beating", having a period which equals the modulation period of the excitation signals. Besides compression, saturation and thermal effects and Low Frequency (LF) dispersion, such modulations in the biasing settings of the device contribute to the above-mentioned spectral regrowth phenomenon.

Representative measurement results can be provided by applying an RF excitation signal comprising at least two different discrete RF excitation frequencies. In a practical measurement set up, an excitation signal comprised of a plurality of discrete RF excitation frequencies, equally spaced and centered around a center frequency has been applied, such as a signal comprised of 29 tones centered around a frequency of 2.2 GHz, with a spacing of 50048 Hz.

For the purpose of processing the measured RF signals and the variations in the bias signals, in accordance with a yet further embodiment of the invention, the measured RF signal data are frequency down-converted, and the measured bias signal data are added to the frequency down-converted RF signal data, providing frequency down-converted RF signal measurement data.

The frequency down-converted RF signal data and the measured bias signal data, in another embodiment of the invention, are added in accordance with a sampling scheme arranged such that the frequencies of the spectral components of the bias signal data are different from the frequencies of the spectral components of the frequency down-converted RF signal data.

The sampling scheme can be advantageously arranged such that the frequency down-converted RF signal data and the bias signal data are combined into a single intermediate frequency (IF) band or base band frequency band for further combined processing of the measurement data.

The RF signal network measurement data provided by the method of the present invention can be advantageously correlated with other data representative of the device under test, such to arrive at a complete representation of the dynamic behavior of the device under several excitation condition. The results obtained can be used for developing mathematical non-linear characterization models for simulating the RF signal behavior of an RF and microwave device. Further, on the basis of the data acquired, biasing circuits can be more accurately designed, among others to reduce the spectral regrowth phenomenon. For this purpose, pre-emphasis and feedback measures can be implemented for obtaining required output signals, in particular in the case of several cascaded RF and microwave stages for compensating interstage interferences.

In a second aspect of the present invention, there is provided an apparatus for collecting Radio Frequency (RF) signal network measurement data of a device under test, the device having signal ports and bias input terminals, the apparatus comprising:

means for applying bias signals at the bias input terminals of the device;

means for exciting the device by a modulated RF excitation signal;

means for measuring RF signal data at the signal ports of the device;

means for measuring bias signal data, and means for processing the RF signal data and the bias signal data, providing the RF signal network measurement data.

In a further embodiment of the apparatus according to the invention, the means for measuring the bias signal data are arranged for measuring variations in the bias signals.

In a still further embodiment of the invention, the means for exciting the device are arranged for providing a periodically modulated RF excitation signal.

In another embodiment of the invention, the means for exciting the device are arranged for generating an RF excitation signal comprising at least two different discrete RF excitation frequencies. In particular the means for exciting the device are arranged for generating an RF excitation signal having equally spaced discrete RF excitation frequencies centered around a center frequency.

For the processing of the measured signal data, in a yet further embodiment of the apparatus according to the invention, frequency converter means are provided for frequency down-conversion of the measured RF signal data, and summation means for adding the measured bias signal data to the frequency down-converted RF signal data, providing frequency down-converted RF signal measurement data.

In an advantageous embodiment of the apparatus according to the invention, the summation means are arranged for adding the frequency down-converted RF signal data and the bias signal data in accordance with a sampling scheme arranged such that the frequencies of the spectral components of the bias signal data are different from the frequencies of the spectral components of the frequency down-converted RF signal data. This provides the possibility of applying a limited number of Analogue-to-Digital Converter (ADC) means to be connected to the summation means for digitally processing the frequency down-converted RF signal measurement data. In practice, four ADC are sufficient to process the measurement data collected from the device under test.

For measuring the bias signal data, in an embodiment of the apparatus according to the invention, current probes are provided for sensing bias currents at the signal ports of the device. By connecting bias tee means, bias voltages at the signal ports of the device can be measured for the purpose of the invention.

For a complete measurement of the non-linear characteristics of RF and microwave devices under test, a Non-linear Network Measurement System (NNMS) is provided, comprising the above disclosed means for applying bias signals to bias input terminals of the device, means for exciting the device by a modulated RF excitation signal, means for measuring RF signal data at said signal ports of said device, means for measuring bias signal data, and means for processing the RF signal data and the bias signal data.

The above-mentioned and other features and advantages of the invention are illustrated in the following detailed description with reference to the enclosed drawings.

BRIEF DESCRIPTION OF THE DRAWINGS

A method and apparatus in accordance with this invention, for collecting RF signal network measurement data of a device under test, will now be described, by way of example, with reference to the accompanying drawings, in which.

DETAILED DESCRIPTION OF THE INVENTION

Figure 1:
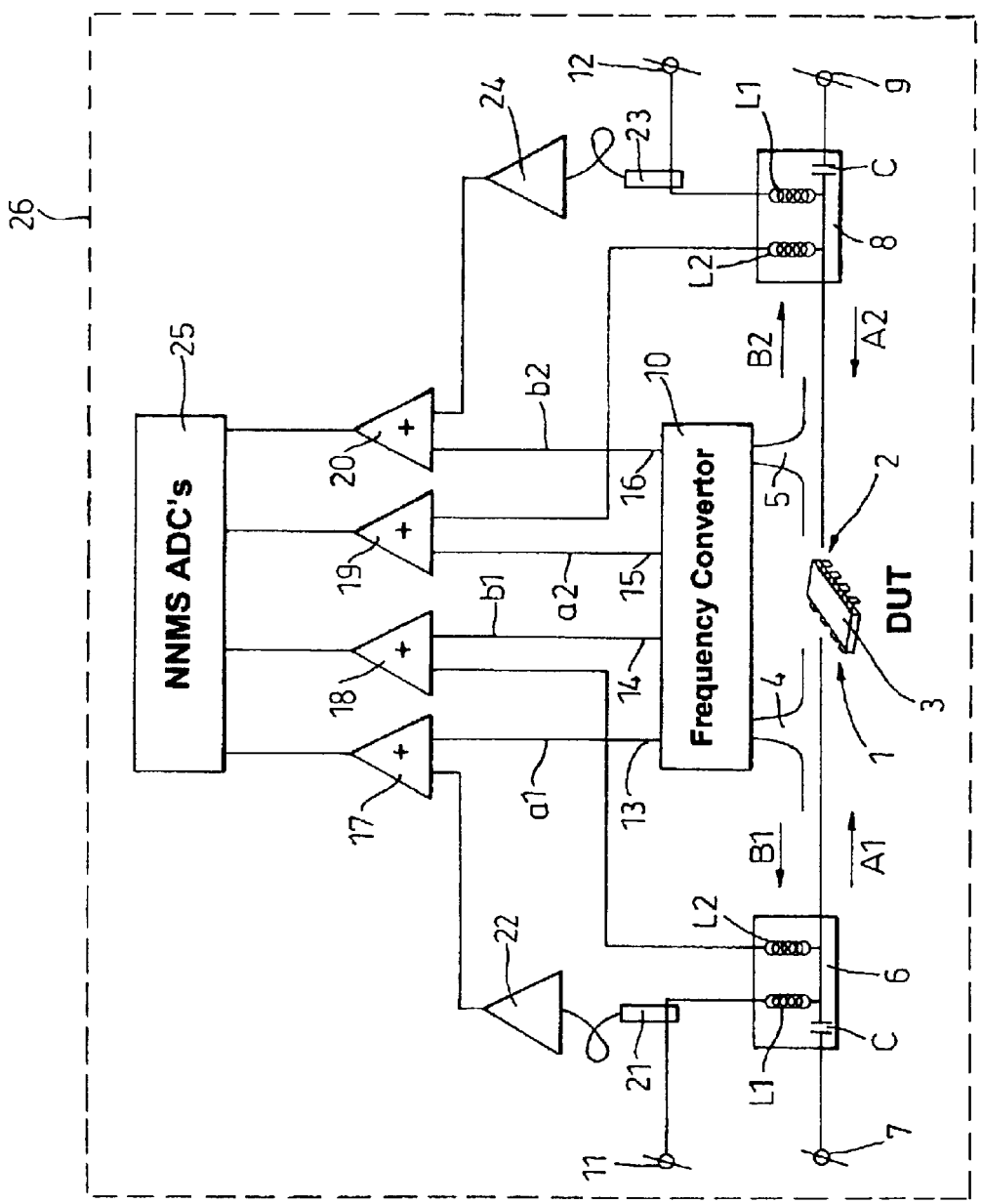
FIG. 1 shows in a schematic and illustrative manner an apparatus for performing the method according to the invention.

FIG. 1 shows a typical measurement set-up for collecting RF signal data of a Device Under Test (DUT) 3 in accordance with the present invention. The DUT 3 comprises a first signal port 1, generally an input signal port, and an second signal port 2, generally an output signal port, each connecting to a first and second coupler 4, 5, respectively.

First coupler 4 connects by an input port thereof to a first bias tee 6, comprising a capacitor C which connects to a first RF terminal 7 for applying an excitation signal at the first signal port 1 of the DUT 3. Second coupler 5 connects to a second bias tee 8, comprising a capacitor C which connects to a second RF terminal 9 for applying an excitation signal at the second signal port 2 of the DUT 3.

The first and second couplers 4, 5 connect to a frequency converter 10 such that incident and reflected RF signals, A1 and B1, and A2 and B2 at the first and second signal ports 1, 2 of the DUT 3, respectively, are provided to the frequency converter 10.

The first and second bias tee 6, 8 each comprise a first and second coil L1, L2 for applying DC bias currents and voltages at the signal ports 1, 2 of the DUT 3. In the circuit shown, coil L1 of the first bias tee 6 connects to a first current bias terminal 11 and coil L1 of the second bias tee 8 connects to a second bias terminal 12.

The frequency converter 10 comprises four outputs 13, 14, 15 and 16 respectively providing frequency down-converted incident and reflected RF signals a1, b1, a2 and b2 representative for the measured incident and reflected RF signals A1, B1, A2 and B2 at the first and second ports 1, 2 of the DUT 3. The frequency down-converted signals a1, b1, a2 and b2 are fed to a first input of summation and signal conditioning amplifiers 17, 18, 19 and 20, respectively.

A second input of the summation and signal conditioning amplifier 17 connects by an RF current probe 21 and an RF probe amplifier 22 to the first bias terminal 11, for measuring the current and current variations of the current bias signal at the first bias terminal 11.

A second input of the summation and signal conditioning amplifier 20 connects by an RF current probe 23 and an RF probe amplifier 24 to the second bias terminal 12, for measuring the current and current variations of the current bias signal at the second bias terminal 12.

A second input of the summation and signal conditioning amplifier 18 connects to the second coil L2 of the first bias tee 6 for measuring the voltage and voltage variations of the voltage bias signal at the first signal port 1 of the DUT 3.

A second input of the summation and signal conditioning amplifier 19 connects to the second coil L2 of the second bias tee 8 for measuring the voltage and voltage variations of the voltage bias signal at the second signal port 2 of the DUT 3.

The summation and signal conditioning amplifiers 17, 18, 19 and 20 connect with their outputs to Analogue-to-Digital converters 25 for further processing of the measured RF and bias signals of the DUT 3.

In an embodiment of the invention, the current probes 21 and 22 are of the Tektronix A6302 type and the current probe amplifiers 21 and 22 are of the Tektronix mainframe TM5003 type. The RF input terminals 7, 9 and the first and second bias terminals 11, 12 are RF connectors. The first and second bias tees 6, 8 are provided by Agilent Technologies, and the summation and signal conditioning amplifiers 17, 18, 19 and 20 are of the Agilent Technologies E1446A type. The first and second coupler 4, 5 and the frequency converter 10 and the ADCs 25 and further processing equipment and means for generating excitation signals at the signal ports 1, 2 of the DUT 3 form part of a Non-linear Network Measurement System provided by Agilent Technologies.

As schematically indicated by broken lines 26, with the exception of the DUT 3, all the components shown can be integrated into a novel Non-linear Network Measurement System for accurately measuring non-linear signal behavior of the DUT 3, inclusive dynamic biasing effects.

In a preferred embodiment of the invention, the summation and signal conditioning amplifiers 17, 18, 19 and 20 operate in accordance with a sampling scheme arranged such that the frequencies of the spectral components of the bias signals are different from the frequencies of the spectral components of the frequency down-converted RF signals a1, b1, a2 and b2, and such that the signals a1, b1, a2 and b2 data and the bias signals are combined into a single intermediate frequency (IF) band or base band frequency band for further combined processing of the measurement data. In the embodiment shown in FIG. 1, this allows the use of one set of four ADCs for the dynamic bias signals as well as for the down-converted RF signals.

For separating the measured signal data, a discrete Fourier transform algorithm can be used. Both signals are then separately calibrated and are finally recombined for further processing and interpretation.

Figure 2:
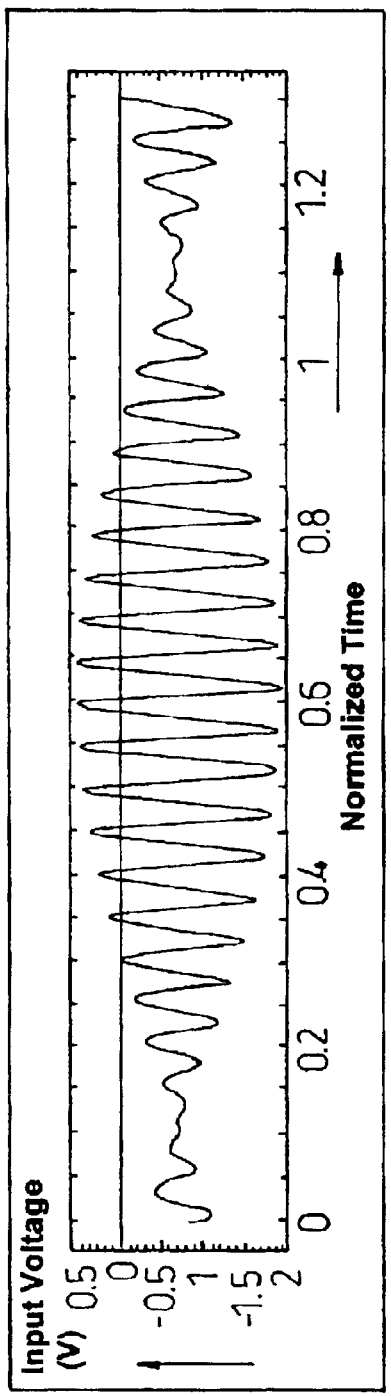
FIGS. 2 and 3 show graphic illustrations for input and output RF waveforms of a device under test, measured with a state of the art Non-linear Network Measurement System (NNMS)

FIG. 2 shows a graphic representation of the input voltage waveform of an RF Integrated Circuit (IC) having an HEMT output transistor, which RFIC is aimed as an amplifier for CDMA applications. With reference to the DUT 3 as shown in FIG. 1, the RFIC has an input signal port 1 and an output signal port 2. The excitation signal is a two-tone signal, with a first tone at an RF carrier frequency of 2.2 GHz and a second tone at 2.2 GHz+50048 Hz. This results in a "beating" of the amplitude of the excitation signal at a rate of 50048 Hz. A normalized two-time axis representation is used to represent the signal in time. In the present case this means that a value of 1 (one) on the time axis corresponds to 20 periods for the RF carrier signal (which approximately equals 9 nsec) and corresponds to a single period of the envelope signal (which equals approximately 20 µs).

Figure 3:
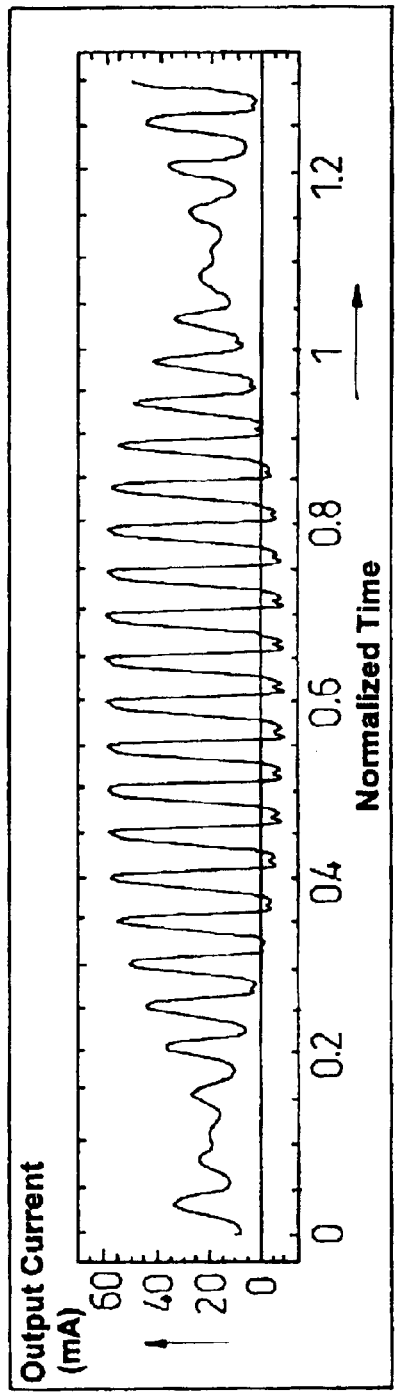

FIG. 3 shows a similar representation for the output current of the RFIC measured with a state of the art NNMS, i.e. without measurement and processing of the dynamics of the bias signals. It is noted that clipping of the RF output waveform occurs at the lower end of the RF time scale.

Further observe that a negative output current seem to occur at the output of the RFIC, which is physically non-sense for the kind of technology used (HEMT output transistor).

Figure 4:
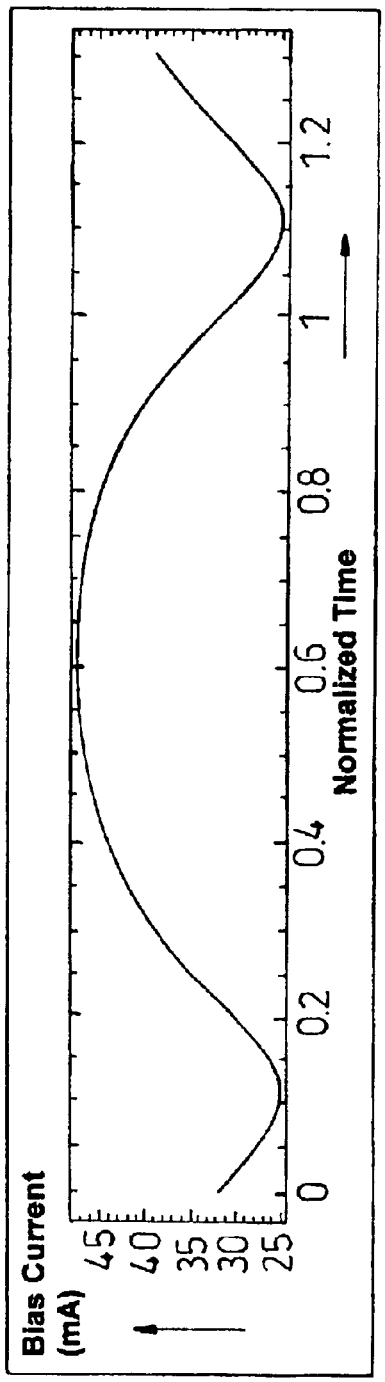
FIGS. 4 and 5 show graphic illustrations for the bias current at the output and the output current waveforms of the same device under test used for the measurements shown in FIGS. 2 and 3, measured and processed in accordance with the present invention.

FIG. 4 shows the dynamic bias current measured at the output of the RFIC. As expected the bias current varies with time and has the same period as the applied modulation.

Figure 5:
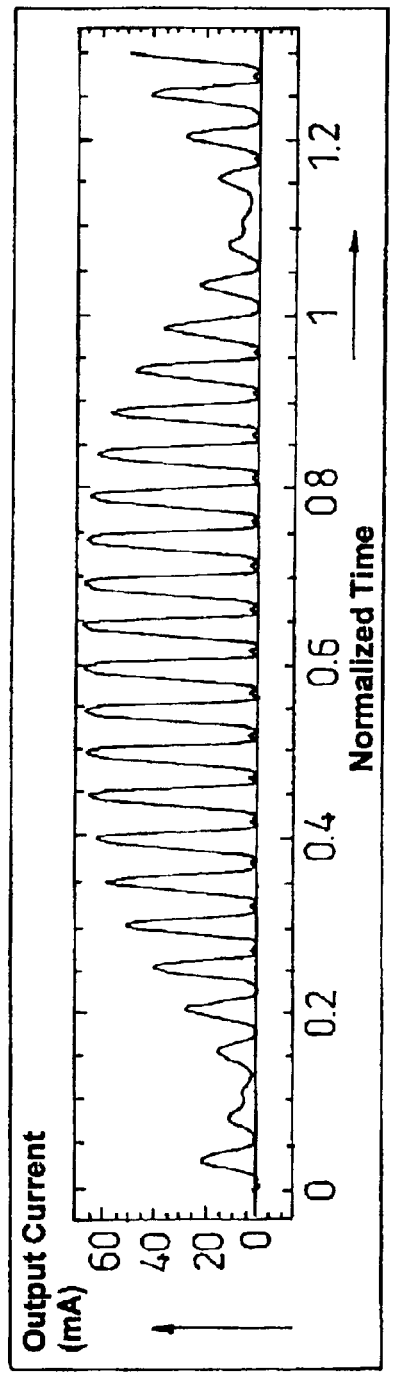

Adding this dynamic bias current to the RF output current waveform of FIG. 3 in accordance with the present invention, this results in a complete RF output waveform measurement which includes both RF envelope and dynamic bias effects, as shown in FIG. 5. It is noted that there is not only clipping at the lower end on the RF time scale, but also on the modulation time scale. This waveform is what one actually expects at the output of the RFIC, because the output stage is a HEMT transistor which is pinched off to a zero current.

FIGS. 6, 7, 8 and 9 show like waveforms as FIGS. 2, 3, 4 and 5, for the same RFIC however a different excitation signal consisting of 29 tones or discrete frequencies, centered around 2.2 GHz, spaced 50048 Hz. The total bandwidth of the modulated signal amounts as such 1.5 MHz.

Figure 6:
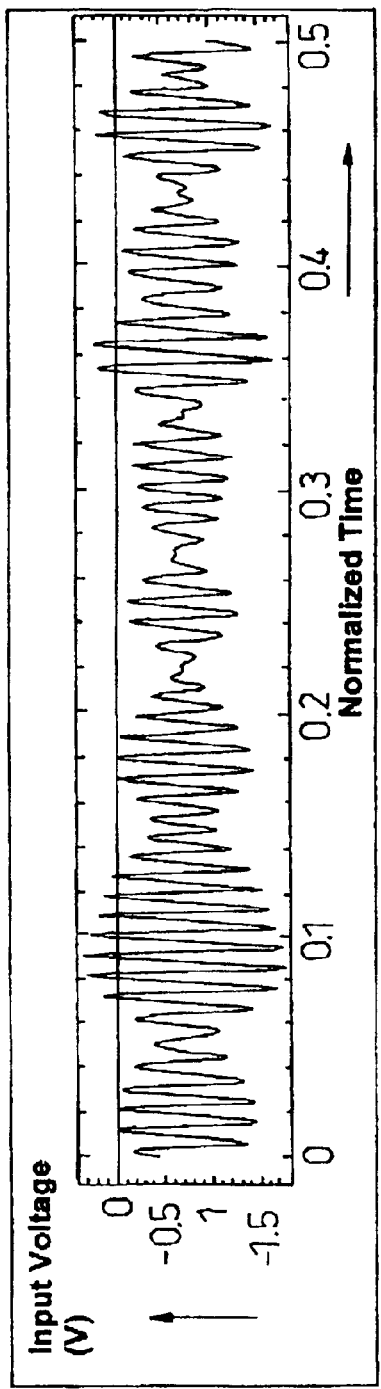
FIGS. 6, 7, 8 and 9 show like waveforms as FIGS. 2, 3, 4 and 5, however for a different excitation of the device under test.

FIG. 6 represents the input voltage waveform. This is also a normalized two-tone time scale, where a 1 (one) corresponds to one period of the modulation and to 100 period of the RF carrier.

Figure 7:
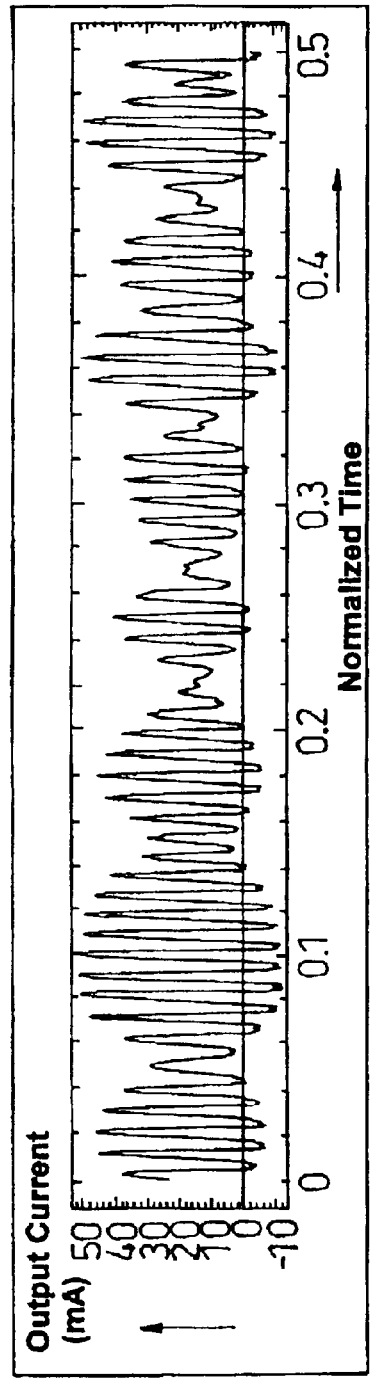

FIG. 7 represents the output current waveform. As with the two-tone case, one clearly notes the non-physical negative current.

Figure 8:
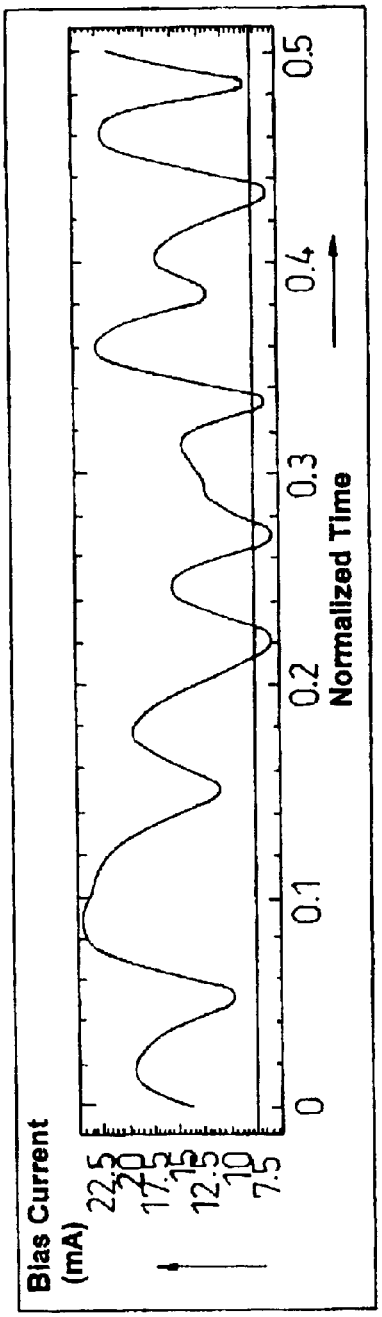
Figure 9:
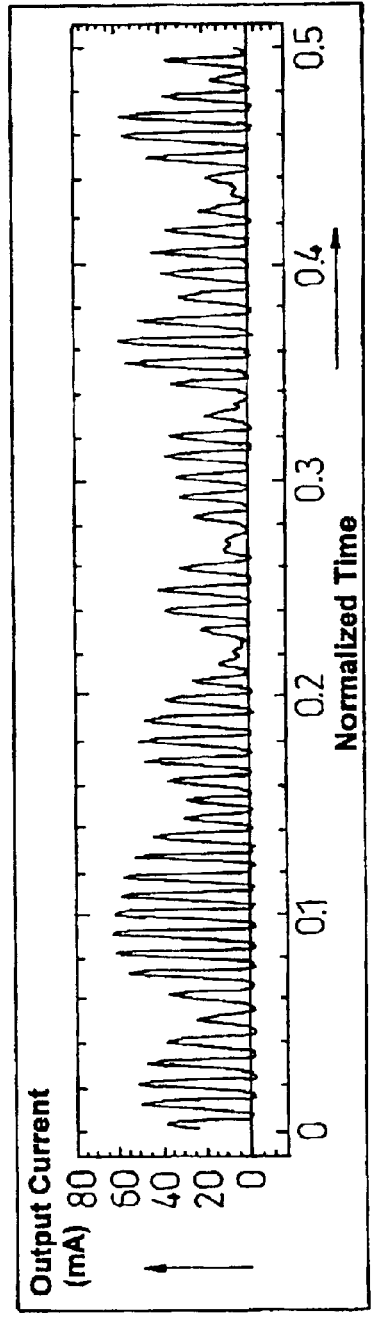

FIG. 8 represents the measured dynamic bias current at the output of the RFIC. Completing the data of FIG. 7 with the data of FIG. 8 results in the output current waveform shown in FIG. 9, which comes more closely to the actual output current waveform for the device under test.

For the measurements presented above, the RFIC was biased in a class-AB operating mode.

The invention is not limited to the arrangement and excitation signals shown. Those skilled in the art will appreciate that a number of modifications can be made for measuring and compensating the dynamic behavior of bias settings of a device under test, without departing from the novel and inventive teachings of the present invention.

What is claimed is:

1. A method of collecting Radio Frequency (RF) signal network measurement data of a device under test, said method comprising:

applying a bias signal to said device;

exciting said device by a modulated RF excitation signal;

measuring an RF signal at a signal port of said device to yield RF signal data;

measuring said bias signal, to yield bias signal data; and compensating said RF signal data, externally of said device, for a variation in said bias signal data.

2. A method according to claim 1, wherein said bias signal data are provided by measuring variations in said bias signal.

3. A method according to claim 1, wherein said modulated RF excitation signal comprises a periodically modulated RF excitation signal.

4. A method according to claim 1, wherein said modulated RF excitation signal comprises at least two different, concurrent, RF excitation frequencies.

5. A method according to claim 4, wherein said at least two different, concurrent, RF excitation frequencies are equally spaced and centered around a center frequency.

6. A method according to claim 1, wherein said measured RF signal data are frequency down-converted for processing thereof, and wherein said measured bias signal data are added to said frequency down-converted RF signal data, providing frequency down-converted RF signal measurement data.

7. A method according to claim 6, wherein said frequency down-converted RF signal data and said bias signal data are added in accordance with a sampling scheme arranged such that frequencies of spectral components of said bias signal data are different from frequencies of spectral components of said frequency down-converted RF signal data.

8. A method according to claim 7, wherein said sampling scheme is arranged such that said frequency down-converted RF signal data and said bias signal data are combined into an intermediate frequency (IF) band or base band frequency band.

9. A method according to claim 1, wherein said RF signal network measurement data are correlated with other data representative of said device under test, such to provide additional data representative for dynamic behavior of said device.

10. A method according to claim 1, wherein said exciting said device comprises applying said modulated RF excitation signal at an RF terminal of a bias tee connecting to a signal port of said device.

11. A method according to claim 1, wherein said applying said bias signal comprises applying said bias signal at a bias input terminal of a bias tee connecting to said device.

12. A method according to claim 11, wherein said measuring said bias signal comprises measuring said bias at said bias input terminal of said bias tee.

13. An apparatus for collecting Radio Frequency (RF) signal network measurement data of a device under test, said apparatus comprising:
    a bias source for applying a bias signal said device;
    an RF source for exciting said device by a modulated RF excitation signal;
    an RF measuring system for measuring an RF signal at a signal port of said device to
    yield RF signal data;
    a bias measuring system for measuring said bias signal to yield bias signal data, and
    a processing system for compensating said RF signal data, externally of said device,
    for a variation in said bias signal data.

14. An apparatus according to claim 13, wherein said bias measuring system measures variations in said bias signal.

15. An apparatus according to claim 13, wherein said modulated RF excitation signal comprises a periodically modulated RF excitation signal.

16. An apparatus according to claim 13, wherein said modulated RF excitation signal comprises at least two different, concurrent, RF excitation frequencies.

17. An apparatus according to claim 16, wherein said at least two different, concurrent, RF excitation frequencies are equally spaced and centered around a center frequency.

18. An apparatus according to claim 13, further comprising a frequency converter for frequency down-converting said measured RF signal data, and an adder for adding said measured bias signal data to said frequency down-converted RF signal data, providing frequency down-converted RF signal measurement data.

19. An apparatus according to claim 18, wherein said adder adds said frequency down-converted RF signal data and said bias signal data in accordance with a sampling scheme arranged such that frequencies of spectral components of said bias signal data are different from frequencies of spectral components of said frequency down-converted RF signal data.

20. An apparatus according to claim 19, further comprising an Analogue-to-Digital Converter (ADC) connected to said adder for digitally processing said frequency down-converted RF signal measurement data.

21. An apparatus according to claim 13, wherein said bias measuring system comprises a current probe for sensing bias current at said signal port.

22. An apparatus according to claim 13, wherein said bias measuring system comprises a bias tee for sensing a bias voltage at said signal port.

23. An apparatus according to claim 13, further comprising a bias tee having an RF terminal for applying said modulated RF excitation signal to said device.

24. An apparatus according to claim 13, further comprising a bias tee having a bias input terminal for applying said bias signal to said device.

25. An apparatus according to claim 24, further comprising a current probe for measuring a bias current at said bias input terminal.

26. An apparatus according to claim 24, wherein said bias tee is arranged for measuring a bias voltage at said signal port of said device.

27. A Non-linear Network Measurement System (NNMS) arranged for measuring non-linear signal behavior of a device under test, said NNMS comprising:
    a bias source for applying a bias signal to said device;
    an RF source for exciting said device by a modulated RF excitation signal;
    an RF measuring system for measuring an RF signal at a signal port of said device to yield RF signal data;
    a bias measuring system for measuring said bias signal to yeild bias signal data; and
    a processing system for compensating said RF signal data, externally of said device, for a variation in said bias signal data.

* * * * *